United States Patent
Kosowsky et al.

(10) Patent No.: US 9,224,728 B2
(45) Date of Patent: Dec. 29, 2015

(54) EMBEDDED PROTECTION AGAINST SPURIOUS ELECTRICAL EVENTS

(75) Inventors: Lex Kosowsky, San Jose, CA (US);
Robert Fleming, San Jose, CA (US);
Bhret Graydon, San Jose, CA (US);
Daniel Vasquez, San Jose, CA (US)

(73) Assignee: LITTELFUSE, INC., Chicago, IL (US)

( * ) Notice: Subject to any disclaimer, the term of this patent is extended or adjusted under 35 U.S.C. 154(b) by 410 days.

(21) Appl. No.: 13/096,860

(22) Filed: Apr. 28, 2011

(65) Prior Publication Data

US 2011/0211289 A1    Sep. 1, 2011

Related U.S. Application Data

(63) Continuation-in-part of application No. 13/035,791, filed on Feb. 25, 2011.

(60) Provisional application No. 61/328,965, filed on Apr. 28, 2010, provisional application No. 61/308,825, filed on Feb. 26, 2010.

(51) Int. Cl.
*H05K 1/18* (2006.01)
*H01L 27/02* (2006.01)
*H05K 1/02* (2006.01)

(52) U.S. Cl.
CPC .......... *H01L 27/0288* (2013.01); *H05K 1/0259* (2013.01); *H05K 2201/0738* (2013.01)

(58) Field of Classification Search
CPC .................................................. H01L 27/0288
USPC ......... 174/250–268; 361/56, 191.1, 111, 127, 361/760, 763
See application file for complete search history.

(56) References Cited

U.S. PATENT DOCUMENTS

| | | |
|---|---|---|
| 3,347,724 A | 10/1967 | Schneble, Jr. et al. |
| 3,685,026 A | 8/1972 | Wakabayashi et al. |
| 3,685,028 A | 8/1972 | Wakabayashi et al. |
| 3,723,635 A | 3/1973 | Smith |
| 3,808,576 A | 4/1974 | Castonguay et al. |
| 3,926,916 A | 12/1975 | Mastrangelo |
| 3,977,957 A | 8/1976 | Kosowsky et al. |
| 4,113,899 A | 9/1978 | Henry et al. |
| 4,133,735 A | 1/1979 | Afromowitz et al. |
| 4,252,692 A | 2/1981 | Taylor et al. |
| 4,269,672 A | 5/1981 | Inoue |

(Continued)

FOREIGN PATENT DOCUMENTS

| | | |
|---|---|---|
| CH | 663491 A5 | 12/1987 |
| DE | 3040784 A1 | 5/1982 |

(Continued)

OTHER PUBLICATIONS

Breton et al., "Mechanical properties of multiwall carbon nanotubes/epoxy composites: influence of network morphology," Carbon Elsevier UK, vol. 42, No. 5-6, pp. 1027-1030 (2004).

(Continued)

*Primary Examiner* — Yuriy Semenenko
(74) *Attorney, Agent, or Firm* — Kacvinsky Daisak Bluni PLLC

(57) ABSTRACT

Various disclosed aspects provide for protecting components (e.g., integrated circuits) from spurious electrical overvoltage events, such as electrostatic discharge. Embedded components with voltage switchable dielectric materials may protect circuits against electrostatic discharge.

18 Claims, 6 Drawing Sheets

(56) References Cited

U.S. PATENT DOCUMENTS

| | | |
|---|---|---|
| 4,331,948 A | 5/1982 | Malinaric et al. |
| 4,359,414 A | 11/1982 | Mastrangelo |
| 4,405,432 A | 9/1983 | Kosowsky |
| 4,439,809 A | 3/1984 | Weight et al. |
| 4,506,285 A | 3/1985 | Einzinger et al. |
| 4,591,411 A | 5/1986 | Reimann |
| 4,642,160 A | 2/1987 | Burgess |
| 4,702,860 A | 10/1987 | Kinderov et al. |
| 4,714,952 A | 12/1987 | Takekawa et al. |
| 4,726,877 A | 2/1988 | Fryd et al. |
| 4,726,991 A | 2/1988 | Hyatt et al. |
| 4,799,128 A | 1/1989 | Chen |
| 4,888,574 A | 12/1989 | Rice et al. |
| 4,892,776 A | 1/1990 | Rice |
| 4,918,033 A | 4/1990 | Bartha et al. |
| 4,928,199 A | 5/1990 | Diaz et al. |
| 4,935,584 A | 6/1990 | Boggs |
| 4,977,357 A | 12/1990 | Shrier |
| 4,992,333 A | 2/1991 | Hyatt |
| 4,996,945 A | 3/1991 | Dix, Jr. |
| 5,068,634 A | 11/1991 | Shrier |
| 5,092,032 A | 3/1992 | Murakami |
| 5,095,626 A | 3/1992 | Kitamura et al. |
| 5,099,380 A | 3/1992 | Childers et al. |
| 5,142,263 A | 8/1992 | Childers et al. |
| 5,148,355 A | 9/1992 | Lowe et al. |
| 5,167,778 A | 12/1992 | Kaneko et al. |
| 5,183,698 A | 2/1993 | Stephenson et al. |
| 5,189,387 A | 2/1993 | Childers et al. |
| 5,246,388 A | 9/1993 | Collins et al. |
| 5,248,517 A | 9/1993 | Shrier et al. |
| 5,252,195 A | 10/1993 | Kobayashi et al. |
| 5,260,848 A | 11/1993 | Childers |
| 5,262,754 A | 11/1993 | Collins |
| 5,278,535 A | 1/1994 | Xu et al. |
| 5,282,312 A | 2/1994 | DiStefano et al. |
| 5,294,374 A | 3/1994 | Martinez et al. |
| 5,295,297 A | 3/1994 | Kitamura et al. |
| 5,300,208 A | 4/1994 | Angelopoulos et al. |
| 5,317,801 A | 6/1994 | Tanaka et al. |
| 5,319,328 A * | 6/1994 | Turunen .................. 333/202 |
| 5,340,641 A | 8/1994 | Xu |
| 5,347,258 A | 9/1994 | Howard et al. |
| 5,354,712 A | 10/1994 | Ho et al. |
| 5,367,764 A | 11/1994 | DiStefano et al. |
| 5,378,858 A | 1/1995 | Bruckner et al. |
| 5,380,679 A | 1/1995 | Kano |
| 5,393,597 A | 2/1995 | Childers et al. |
| 5,403,208 A | 4/1995 | Felcman et al. |
| 5,404,637 A | 4/1995 | Kawakami |
| 5,413,694 A | 5/1995 | Dixon et al. |
| 5,416,662 A | 5/1995 | Kurasawa et al. |
| 5,440,075 A | 8/1995 | Kawakita et al. |
| 5,444,593 A | 8/1995 | Allina |
| 5,476,471 A | 12/1995 | Shifrin et al. |
| 5,481,795 A | 1/1996 | Hatakeyama et al. |
| 5,483,407 A | 1/1996 | Anastasio et al. |
| 5,487,218 A | 1/1996 | Bhatt et al. |
| 5,493,146 A | 2/1996 | Pramanik et al. |
| 5,501,350 A | 3/1996 | Yoshida et al. |
| 5,502,889 A | 4/1996 | Casson et al. |
| 5,510,629 A | 4/1996 | Karpovich et al. |
| 5,550,400 A | 8/1996 | Takagi et al. |
| 5,557,136 A | 9/1996 | Gordon et al. |
| 5,654,564 A | 8/1997 | Mohsen |
| 5,669,381 A | 9/1997 | Hyatt |
| 5,685,070 A | 11/1997 | Alpaugh et al. |
| 5,708,298 A | 1/1998 | Masayuki et al. |
| 5,714,794 A | 2/1998 | Tsuyama et al. |
| 5,734,188 A | 3/1998 | Murata et al. |
| 5,744,759 A | 4/1998 | Ameen et al. |
| 5,781,395 A | 7/1998 | Hyatt |
| 5,802,714 A | 9/1998 | Kobayashi et al. |
| 5,807,509 A | 9/1998 | Shrier et al. |
| 5,808,351 A | 9/1998 | Nathan et al. |
| 5,834,160 A | 11/1998 | Ferry et al. |
| 5,834,824 A | 11/1998 | Shepherd et al. |
| 5,834,893 A | 11/1998 | Bulovic et al. |
| 5,848,467 A | 12/1998 | Khandros et al. |
| 5,856,910 A | 1/1999 | Yurchenco et al. |
| 5,865,934 A | 2/1999 | Yamamoto et al. |
| 5,869,869 A | 2/1999 | Hively |
| 5,874,902 A | 2/1999 | Heinrich et al. |
| 5,906,042 A | 5/1999 | Lan et al. |
| 5,910,685 A | 6/1999 | Watanabe et al. |
| 5,926,951 A | 7/1999 | Khandros et al. |
| 5,940,683 A | 8/1999 | Holm et al. |
| 5,946,555 A | 8/1999 | Crumly et al. |
| 5,955,762 A | 9/1999 | Hively |
| 5,956,612 A | 9/1999 | Elliott et al. |
| 5,962,815 A | 10/1999 | Lan et al. |
| 5,970,321 A | 10/1999 | Hively |
| 5,972,192 A | 10/1999 | Dubin et al. |
| 5,977,489 A | 11/1999 | Crotzer et al. |
| 6,013,358 A | 1/2000 | Winnett et al. |
| 6,023,028 A | 2/2000 | Neuhalfen |
| 6,064,094 A | 5/2000 | Intrater et al. |
| 6,108,184 A | 8/2000 | Minervini et al. |
| 6,114,672 A | 9/2000 | Iwasaki |
| 6,130,459 A | 10/2000 | Intrater |
| 6,160,695 A | 12/2000 | Winnett et al. |
| 6,172,590 B1 | 1/2001 | Shrier et al. |
| 6,184,280 B1 | 2/2001 | Shituba |
| 6,191,928 B1 | 2/2001 | Rector et al. |
| 6,198,392 B1 | 3/2001 | Hahn et al. |
| 6,211,554 B1 | 4/2001 | Whitney et al. |
| 6,239,687 B1 * | 5/2001 | Shrier et al. .................. 338/21 |
| 6,251,513 B1 | 6/2001 | Rector et al. |
| 6,310,752 B1 | 10/2001 | Shrier et al. |
| 6,316,734 B1 | 11/2001 | Yang |
| 6,340,789 B1 | 1/2002 | Petritsch et al. |
| 6,351,011 B1 | 2/2002 | Whitney et al. |
| 6,373,719 B1 | 4/2002 | Behling et al. |
| 6,407,411 B1 | 6/2002 | Wojnarowski |
| 6,433,394 B1 | 8/2002 | Intrater |
| 6,448,900 B1 | 9/2002 | Chen |
| 6,455,916 B1 | 9/2002 | Robinson |
| 6,468,593 B1 | 10/2002 | Iazawa |
| 6,512,458 B1 | 1/2003 | Kobayashi et al. |
| 6,534,422 B1 | 3/2003 | Ichikawa et al. |
| 6,542,065 B2 | 4/2003 | Shrier et al. |
| 6,549,114 B2 * | 4/2003 | Whitney et al. .................. 338/21 |
| 6,570,765 B2 | 5/2003 | Behling et al. |
| 6,593,597 B2 | 7/2003 | Sheu |
| 6,621,172 B2 | 9/2003 | Nakayama et al. |
| 6,628,498 B2 | 9/2003 | Whitney et al. |
| 6,642,297 B1 | 11/2003 | Hyatt et al. |
| 6,657,532 B1 | 12/2003 | Shrier et al. |
| 6,677,183 B2 | 1/2004 | Sakaguchi et al. |
| 6,693,508 B2 | 2/2004 | Whitney et al. |
| 6,709,944 B1 | 3/2004 | Durocher et al. |
| 6,741,217 B2 | 5/2004 | Toncich et al. |
| 6,797,145 B2 | 9/2004 | Kosowsky |
| 6,882,051 B2 | 4/2005 | Majumdar et al. |
| 6,903,175 B2 | 6/2005 | Gore et al. |
| 6,911,676 B2 | 6/2005 | Yoo |
| 6,916,872 B2 | 7/2005 | Yadav et al. |
| 6,981,319 B2 | 1/2006 | Shrier |
| 7,034,652 B2 | 4/2006 | Whitney et al. |
| 7,049,926 B2 | 5/2006 | Shrier et al. |
| 7,053,468 B2 | 5/2006 | Lee |
| 7,064,353 B2 | 6/2006 | Bhat |
| 7,067,840 B2 | 6/2006 | Klauk |
| 7,132,697 B2 | 11/2006 | Weimer et al. |
| 7,132,922 B2 | 11/2006 | Harris et al. |
| 7,141,184 B2 | 11/2006 | Chacko et al. |
| 7,173,288 B2 | 2/2007 | Lee et al. |
| 7,183,891 B2 | 2/2007 | Harris et al. |
| 7,202,770 B2 | 4/2007 | Harris et al. |
| 7,205,613 B2 | 4/2007 | Fjelstand et al. |
| 7,218,492 B2 | 5/2007 | Shrier |
| 7,279,724 B2 | 10/2007 | Collins et al. |
| 7,320,762 B2 | 1/2008 | Greuter et al. |
| 7,341,824 B2 | 3/2008 | Sexton |

(56) References Cited

U.S. PATENT DOCUMENTS

| | | |
|---|---|---|
| 7,417,194 B2 | 8/2008 | Shrier |
| 7,446,030 B2 | 11/2008 | Kosowsky |
| 7,488,625 B2 | 2/2009 | Knall |
| 7,492,504 B2 | 2/2009 | Chopra et al. |
| 7,528,467 B2 | 5/2009 | Lee |
| 7,535,462 B2 | 5/2009 | Spath et al. |
| 7,585,434 B2 | 9/2009 | Morita |
| 7,593,203 B2 * | 9/2009 | Dudnikov et al. ............ 361/56 |
| 7,609,141 B2 | 10/2009 | Harris et al. |
| 7,692,270 B2 | 4/2010 | Subramanyam et al. |
| 7,872,251 B2 | 1/2011 | Kosowsky et al. |
| 7,923,844 B2 | 4/2011 | Kosowsky |
| 8,045,312 B2 * | 10/2011 | Shrier ........................ 361/126 |
| 2002/0004258 A1 | 1/2002 | Nakayama et al. |
| 2002/0050912 A1 | 5/2002 | Shrier et al. |
| 2002/0061363 A1 | 5/2002 | Halas et al. |
| 2003/0010960 A1 | 1/2003 | Greuter et al. |
| 2003/0025587 A1 * | 2/2003 | Whitney et al. ............ 338/22 R |
| 2003/0071245 A1 | 4/2003 | Harris, IV |
| 2003/0079910 A1 | 5/2003 | Kosowsky |
| 2003/0151029 A1 | 8/2003 | Hsu |
| 2003/0218851 A1 | 11/2003 | Harris et al. |
| 2004/0000725 A1 | 1/2004 | Lee |
| 2004/0062041 A1 | 4/2004 | Cross et al. |
| 2004/0063839 A1 | 4/2004 | Kawate et al. |
| 2004/0095658 A1 | 5/2004 | Buretea et al. |
| 2004/0154828 A1 | 8/2004 | Moller et al. |
| 2004/0160300 A1 | 8/2004 | Shrier |
| 2004/0201941 A1 | 10/2004 | Harris et al. |
| 2004/0211942 A1 | 10/2004 | Clark et al. |
| 2004/0241894 A1 | 12/2004 | Nagai et al. |
| 2004/0262583 A1 | 12/2004 | Lee |
| 2005/0026334 A1 | 2/2005 | Knall |
| 2005/0039949 A1 | 2/2005 | Kosowsky |
| 2005/0057867 A1 * | 3/2005 | Harris et al. ................ 361/56 |
| 2005/0083163 A1 | 4/2005 | Shrier |
| 2005/0106098 A1 | 5/2005 | Tsang et al. |
| 2005/0121653 A1 | 6/2005 | Chacko |
| 2005/0175938 A1 | 8/2005 | Casper et al. |
| 2005/0184387 A1 | 8/2005 | Collins et al. |
| 2005/0218380 A1 | 10/2005 | Gramespacher et al. |
| 2005/0255631 A1 | 11/2005 | Bureau et al. |
| 2005/0274455 A1 | 12/2005 | Extrand |
| 2005/0274956 A1 | 12/2005 | Bhat |
| 2005/0275070 A1 | 12/2005 | Hollingsworth |
| 2006/0060880 A1 | 3/2006 | Lee et al. |
| 2006/0069199 A1 | 3/2006 | Charati et al. |
| 2006/0142455 A1 | 6/2006 | Agarwal |
| 2006/0152334 A1 | 7/2006 | Maercklein et al. |
| 2006/0166474 A1 | 7/2006 | Vereecken et al. |
| 2006/0167139 A1 | 7/2006 | Nelson et al. |
| 2006/0181826 A1 | 8/2006 | Dudnikov, Jr. et al. |
| 2006/0181827 A1 | 8/2006 | Dudnikov, Jr. et al. |
| 2006/0193093 A1 | 8/2006 | Bertin |
| 2006/0199390 A1 | 9/2006 | Dudnikov, Jr. et al. |
| 2006/0211837 A1 | 9/2006 | Ko et al. |
| 2006/0214156 A1 | 9/2006 | Pan et al. |
| 2006/0234127 A1 | 10/2006 | Kim |
| 2006/0291127 A1 | 12/2006 | Kim et al. |
| 2007/0114640 A1 | 5/2007 | Kosowsky |
| 2007/0116976 A1 | 5/2007 | Tan et al. |
| 2007/0123625 A1 | 5/2007 | Dorade et al. |
| 2007/0139848 A1 | 6/2007 | Harris et al. |
| 2007/0146941 A1 | 6/2007 | Harris et al. |
| 2007/0208243 A1 | 9/2007 | Gabriel et al. |
| 2007/0241458 A1 | 10/2007 | Ding et al. |
| 2008/0045770 A1 | 2/2008 | Sigmund et al. |
| 2008/0047930 A1 | 2/2008 | Blanchet et al. |
| 2008/0073114 A1 | 3/2008 | Kosowsky et al. |
| 2008/0144355 A1 | 6/2008 | Boeve et al. |
| 2008/0223603 A1 | 9/2008 | Kim et al. |
| 2008/0278873 A1 | 11/2008 | Leduc et al. |
| 2009/0044970 A1 | 2/2009 | Kosowsky |
| 2009/0309074 A1 | 12/2009 | Chen et al. |
| 2009/0310265 A1 | 12/2009 | Fukuoka et al. |
| 2010/0038119 A1 | 2/2010 | Kosowsky |
| 2010/0038121 A1 | 2/2010 | Kosowsky |
| 2010/0040896 A1 | 2/2010 | Kosowsky |
| 2010/0044079 A1 | 2/2010 | Kosowsky |
| 2010/0044080 A1 | 2/2010 | Kosowsky |
| 2010/0047535 A1 | 2/2010 | Kosowsky et al. |
| 2010/0187006 A1 | 7/2010 | Kosowsky et al. |
| 2010/0243302 A1 | 9/2010 | Kosowsky et al. |
| 2010/0270588 A1 | 10/2010 | Kosowsky et al. |
| 2011/0061230 A1 | 3/2011 | Kosowsky |
| 2011/0062388 A1 | 3/2011 | Kosowsky et al. |
| 2011/0089540 A1 * | 4/2011 | Drost et al. ................... 257/660 |
| 2011/0211289 A1 | 9/2011 | Kosowsky et al. |
| 2011/0317318 A1 * | 12/2011 | Fleming et al. ................ 361/56 |

FOREIGN PATENT DOCUMENTS

| | | |
|---|---|---|
| DE | 10115333 A1 | 1/2002 |
| DE | 102004049053 | 5/2005 |
| DE | 102006047377 | 4/2008 |
| EP | 0790758 A1 | 8/1997 |
| EP | 0930623 A1 | 7/1999 |
| EP | 1003229 A1 | 5/2000 |
| EP | 1245586 A2 | 10/2002 |
| EP | 1542240 A2 | 6/2005 |
| EP | 1580809 A2 | 9/2005 |
| EP | 1990834 A2 | 11/2008 |
| JP | 56091464 A | 7/1981 |
| JP | 63 195275 A | 8/1988 |
| JP | 2000062076 A | 2/2000 |
| WO | WO8906859 A2 | 7/1989 |
| WO | WO9602922 A2 | 2/1996 |
| WO | WO9602924 A1 | 2/1996 |
| WO | WO9726665 A1 | 7/1997 |
| WO | WO9823018 A1 | 5/1998 |
| WO | WO9924992 A1 | 5/1999 |
| WO | WO02103085 A1 | 12/2002 |
| WO | WO2005100426 A1 | 10/2005 |
| WO | WO2006130366 A2 | 12/2006 |
| WO | WO2007062170 A2 | 5/2007 |
| WO | WO2007062171 A2 | 5/2007 |
| WO | WO2008016858 A1 | 2/2008 |
| WO | WO2008016859 A1 | 2/2008 |
| WO | WO2008153584 A1 | 12/2008 |

OTHER PUBLICATIONS

Celzard, A., et al., "Conduction Mechanisms in Some Graphite-polymer Composites: The Effect of a Direct-current Electric Field", Journal of Physics: Condensed Matter, 9 (1997) pp. 2225-2237.

Facchetti, Antonio, "Semiconductors for Organic Transistors", Materials Today, vol. 10, No. 3, pp. 28-37.

Fullerene Chemistry—Wikipedia, http://en.wikipedia.org/wiki/Fullerene/chemistry, 6 pages, printed Apr. 8, 2010.

Granstrom et al., "Laminated fabrication of polymeric photovoltaic diodes," Nature, vol. 395, pp. 257-260 (1998).

Guo et al., "Block Copolymer Modified Novolac Epoxy Resin," Polymer Physics, vol. 41, No. 17, pp. 1994-2003 (2003).

Levinson et al. "The Physics of Metal Oxide Varistors," J. App. Phys. 46 (3): 1332-1341 (1975).

Modine, F.A. and Hyatt, H.M. "New Varistor Material", Journal of Applied Physics, 64 (8), Oct. 15, 1988, pp. 4229-4232.

Onoda et al., "Photoinduced Charge Transfer of Conducting Polymer Compositions," IEICE Trans. Electronics, vol. E81-C(7), pp. 1051-1056 (1998).

Raffaelle et al., "Nanomaterial Development for Polymeric Solar Cells," IEEE 4th World Conf on Photovoltaic energy Conversion, pp. 186-189 (2006).

Reese, Colin and Bao, Zhenan, "Organic Single-Crystal Field-Effect Transistors", Materials Today, vol. 10, No. 3, pp. 20-27.

Saunders et al., "Nanoparticle-polymer photovoltaic cells," Adv. Colloid Int. Sci., vol. 138, No. 1, pp. 1-23 (2007).

* cited by examiner

EMBEDDED PROTECTION AGAINST SPURIOUS ELECTRICAL EVENTS

CROSS REFERENCE TO RELATED APPLICATIONS

This application claims the priority benefit of U.S. provisional application No. 61/328,965, filed Apr. 28, 2010, and titled "Embedded Protection Against Spurious Electrical Events;" and is a continuation-in-part and claims the priority benefit of U.S. patent application Ser. No. 13/035,791, filed Feb. 25, 2011, and titled "Electric Discharge Protection for Surface Mounted and Embedded Components," which claims the priority benefit of U.S. provisional application No. 61/308,825, filed Feb. 26, 2010, and titled "Protecting Embedded Components." The above referenced applications are hereby incorporated by reference in their entirety.

BACKGROUND

1. Technical Field

The present application relates to electronic circuit design and architecture and to devices that incorporate such electronic circuits for protection against electrical overvoltage events, and more particularly to systems, designs, circuits, methods, and materials for protecting components and devices from overvoltage electrical events and to devices incorporating such systems, designs, circuits, methods, and materials.

2. Description of Related Art

Electronic devices are often fabricated by assembling and connecting various components (e.g., integrated circuits, passive components, chips, and the like, hereinafter "chips"). Many components, particularly semiconductors, are sensitive to spurious electrical events that apply excessive voltage to the devices in what is termed an overvoltage condition. Examples of overvoltage condition sources include electrostatic discharge (ESD), back electromotive force (EMF), lightning, solar wind, solar flares, switched electromagnetic induction loads such as electric motors and electromagnets, switched heavy resistive loads, large current changes, electromagnetic pulses, spark gap, and the like. Overvoltage conditions may result in a high voltage at a device containing semiconductors such as an IC chip, which may cause large current flow through or within the chip. The large current flow may effectively destroy or otherwise negatively impact the functionality of the semiconductor. However, a system that blocks current associated with an overvoltage event from reaching the components may also impair the desired normal operation of the chip unless properly designed.

Some chips include "on-chip" protection against some overvoltage events (e.g., a mild ESD event) that may be expected during packaging of the chip (e.g., protection against Human Body Model events).

A chip may be packaged (e.g., attached to a substrate). A packaged chip may be connected to additional (e.g., ex-chip) overvoltage protection devices, that protect the packaged chip against more severe (e.g., higher voltage) overvoltage events. Inasmuch as the on-chip and off-chip overvoltage protection devices are in electrical communication, the off-chip overvoltage protection device may be required to "protect" the on-chip overvoltage protection device. Off-chip overvoltage protection devices using discrete components are difficult to add when the substrate is manufactured. Moreover, on-chip protection is difficult to optimize across a complete system or subsystem. Examples of specifications for ESD testing include IEC 61000-4-2 and JESD22-A114E.

A printed circuit board, printed wiring board, or similar substrate (hereinafter also referred to as PCB) may be used to assemble, support, and connect electronic components. A PCB typically includes a substrate of dielectric material and one or more conductive leads to provide electrical conductivity among various attached components, chips, and the like. Typically, a pattern of metallic leads is plated (e.g., using printing technology such as silk-screening) onto the dielectric substrate to provide electrical connectivity. Alternatively a metallic layer (e.g., a layer of Cu) is applied to the substrate and subsequently etched in the desired pattern. Multiple layers of conductive patterns and/or dielectric materials may be disposed on a PCB. The layers may be connected using vias. Printed circuit boards including 14 or more layers are not uncommon.

A PCB is typically used for supporting and connecting various integrated electronic components, such as chips, packages, and other integrated devices. The PCB may also support and connect discrete components, such as resistors, capacitors, inductors, and the like, and provide connections between integrated and discrete components. The conductive patterns and/or layers in the PCB and other components or areas within electronic devices sometimes provide paths for conducting overvoltage events that could damage or otherwise negatively impact components.

SUMMARY

The problem of preventing conduction of overvoltage events to a sensitive component on a PCB may be addressed by embedding a structure of VSD (voltage switchable dielectric) material, sometimes also denoted as "VSDM" in the substrate of the PCB. The VSD material may conduct current of an incoming electrical overvoltage signal to a ground or another point upon switching to a substantially conductive state in response to a rise in voltage above a threshold level. A circuit element, such as a filter, may be disposed to shield the component by further attenuating any portion of the incoming signal that is transmitted to the component and/or by blocking at least partially a rise in voltage while the VSD material switches to a conductive state. While the voltage at the VSD material is below the threshold level, the VSD material is substantially insulative, thereby substantially blocking signal transmission to the ground. The VSD material may be embedded as a layer, pattern or vias within the PCB. Circuit elements may also be embedded within a layer, pattern, or vias of the PCB.

Various aspects of a protection circuit for protecting an electronic component of an electronic device against an overvoltage condition such as an ESD signal include a VSD material embedded in a substrate. The VSD material may be disposed between a first point located along an expected ESD signal path and a second point located within the device. The VSD material may have a characteristic voltage level. The protection circuit further includes a circuit element disposed between the first point and the electronic component. The VSD material is designed to transmit to the second point a first portion of the ESD signal present at the first point when a voltage of the ESD signal exceeds the characteristic voltage level. The circuit element is designed to transmit a second portion of the ESD signal to the electronic component while modifying at least one signal characteristic of the second portion of the ESD signal. In some embodiments, the substrate is a PCB and the VSD material is a part of a layer of the PCB. The circuit element may be embedded in the substrate. The circuit element may be embedded in a via. The via may comprise the circuit element.

In various embodiments, an electronic device comprises a substrate, a component mounted on the substrate, a connector configured to receive a signal, the connector mounted on the substrate and electronically coupled to the component, and a filter circuit configured to couple the signal from the connector to the component. A VSD material may be embedded within the electronic device and electrically coupled to the connector and the filter circuit. The VSD material switches between a low impedance when the signal level is greater than a switching threshold and a high impedance when the signal level is less than the switching threshold. In some embodiments, the substrate is a PCB and the VSD material is at least a part of a layer of the PCB. The filter circuit may be embedded in the substrate. The filter circuit may be embedded in a via.

BRIEF DESCRIPTION OF THE DRAWINGS

Embodiments described herein may be referenced to any one or more of the following figures.

DETAILED DESCRIPTION

Figure 1:
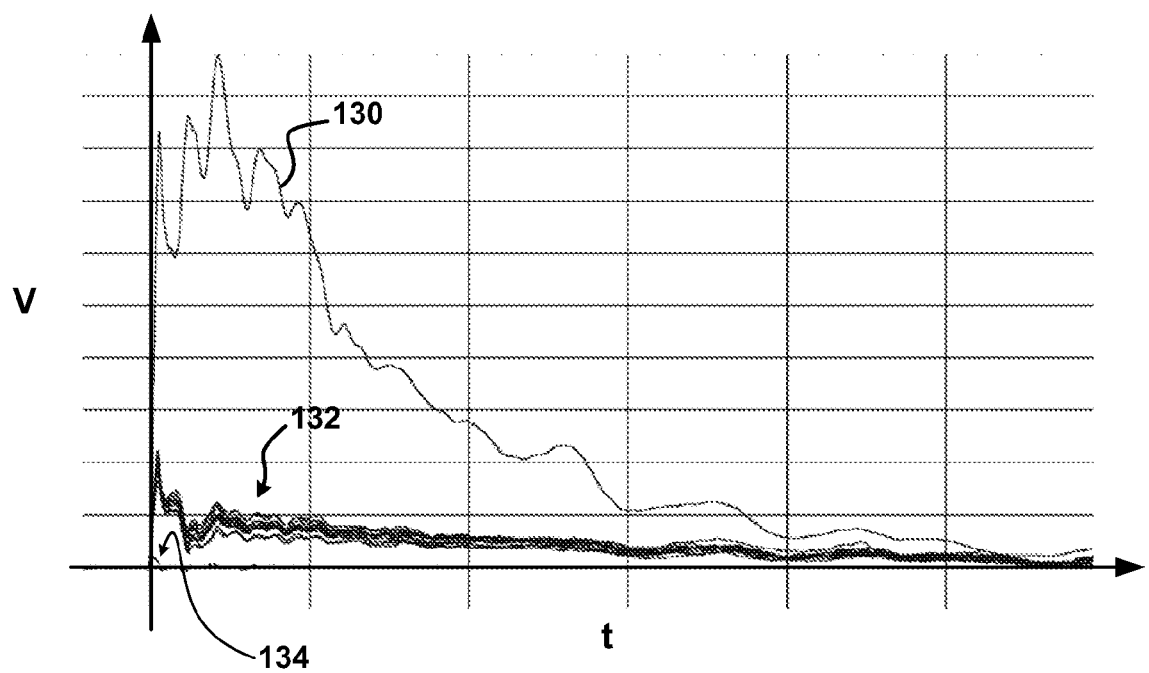
FIG. 1 illustrates a response of a VSD (voltage switchable dielectric) material to an electrical signal in connection with various embodiments of the present invention.

Protection against overvoltage events in a device in accordance with various embodiments of the present invention may include incorporating a voltage switchable dielectric material (VSD material) in the device. While those skilled in the art will recognize that overvoltage events encompass multiple events, ESD (electrostatic discharge) may be used herein to generally describe an overvoltage event. In general, a VSD material may have a limited ability to conduct current or otherwise operate in the presence of high signal voltages, current intensities, and energy or power levels before being damaged, possibly irreversibly damaged. Additionally, a VSD material may also be damaged if an electric signal that is normally within operating specifications persists for too long (e.g., the VSD material may heat up while conducting such signals and eventually break down). For example, a VSD material may be able to function normally when exposed to an input signal with a voltage level of 10 KV that lasts less than 100 nanoseconds, but may be damaged if that signal continues to be applied for more than a few milliseconds. The ability of a VSD material to tolerate high levels of voltage, current, power or energy before becoming damaged may depend on various factors, such as the particular composition of the VSD material, the specific characteristics of a corresponding VSD material structure (e.g., a VSD material structure with larger physical dimensions may be able to conduct higher current densities), the corresponding circuit architecture, the presence of other ESD protective components, and the characteristics of the device in which the VSD material is incorporated.

In one embodiment, the VSD material may be embedded in the device as a layer or a structure and configured to shunt at least a portion of an ESD signal safely through the device to a ground or to otherwise conduct at least a portion of an ESD signal to a predefined point. In one embodiment, a protective circuit such as a filter may be incorporated in the device for communicating useful signals and blocking high frequency components of the overvoltage while the VSD material responds to the rise in voltage when an ESD occurs. The filter may also be embedded in the device as a layer, a structure, or a via.

A VSD material in accordance with various embodiments of the present invention is a material that exhibits nonlinear resistance as a function of voltage. While a VSD material exhibits nonlinear resistance, not all materials exhibiting nonlinear resistance are VSD materials. For example, a material for which resistance changes as a function of temperature but does not substantially change as a function of voltage would not be construed as a VSD material for purposes of embodiments of the present invention. In various embodiments, VSD materials also exhibit nonlinear resistance variation as a function of additional operating parameters such as current, energy field density, light or other electromagnetic radiation input, and/or other similar parameters.

The variation of the resistance as a function of voltage of a VSD material in accordance with various embodiments of the present invention includes a transition from a state of high resistance to a state of low resistance. This transition occurs at about a specific voltage value, which may be variously referred to as a "characteristic voltage," "characteristic voltage level," "switching voltage," or "switching voltage level." The characteristic voltage may differ for various formulations of VSD material, but is relatively stable for a given formulation. The characteristic voltage for a particular formulation may be a function of parameters such as temperature and/or incident electromagnetic energy at various wavelengths including optical, infrared, UV, microwave, and/or the like.

For a given VSD material composition, the characteristic voltage level may be defined as a voltage per unit of length. In this case, the effective voltage that must be applied to a structure of VSD material before the characteristic voltage level is reached (and consequently the VSDM material becomes substantially conductive) may be a function of the thickness of the VSD material disposed between the two points where the voltage is applied (and possibly also a function of the relative shape, geometry, volume, density variation, and other analogous variables relating to the VSD material structure). In these instances, a characteristic voltage level may be defined in terms of Volts per mil (V/mil) or Volts per millimeter (V/mm).

Conversely, for a structure of VSD material with a known distance between two points where a voltage is applied (e.g., when the thickness of a VSD material layer is known and a voltage is applied across the thickness of the layer), the characteristic voltage may be defined as an absolute voltage (e.g., the switching for voltage for this VSD material structure may be specified as a specific value in Volts).

Consequently, the characteristic voltage of a VSD material may be defined as a voltage value per unit length or as a specific voltage value, depending on whether the VSD material is being considered as a VSD material structure with an undefined physical shape, dimension, or volume, or as a specific structure with known dimensional characteristics. For the sake of simplicity, the descriptions in this patent may refer to characteristic voltages in terms of absolute voltage values in connection with various embodiments, but in each case the corresponding characteristic voltage in terms of Volts per unit length may be obtained through an appropriate conversion by taking into account the dimensional characteristics of the respective VSD material structure.

A VSD material may behave substantially as an insulator since it is substantially not conductive (i.e., substantially insulative) at voltages below the respective characteristic voltage level. This may be referred to as an insulation or insulating state. Voltage below the characteristic voltage level may be referred to as low voltage (at least relative to voltages above the characteristic voltage level). In such operating regimes below the characteristic voltage level, a VSD material provided in embodiments of the current invention may also be construed as having attributes of a semiconductor, similar to semiconductor materials that are suitable to serve as substrates in semiconductor manufacturing processes. A VSD material behaves substantially as an insulator for both positive and negative voltages when the magnitude of the voltage is below the characteristic voltage level.

At voltages higher than its characteristic voltage level, a VSD material in accordance with various embodiments of the present invention behaves substantially as a conductor by having substantially no electric resistance, or relatively low resistance. This may be referred to as a conductive state. Voltage above the characteristic voltage level may be referred to as high voltage. The VSD material is conductive or substantially conductive for both positive and negative voltages when the magnitude of the voltage is above the characteristic voltage level. The characteristic voltage may be either positive or negative.

In an ideal model, the operation of a VSD material provided in various embodiments of the present invention is approximated as having infinite resistance at voltages below the characteristic voltage, and zero resistance at voltages above the characteristic voltage. In normal operating conditions, however, VSD materials typically have high, but finite resistance at voltages below the characteristic voltage, and low, but nonzero resistance at voltages above the characteristic voltage. As an example, for a particular VSD material, the ratio of the resistance at low voltage to the resistance at high voltage may be expected to approach a large value (e.g., in the range of $10^3$, $10^6$, $10^9$, $10^{12}$, or higher). In an ideal model, this ratio may be approximated as infinite, or otherwise very high.

The VSD material provided in various embodiments of the present invention exhibits high repeatability (i.e., reversibility) in its operation in both the low voltage regimes and the high voltage regimes. In some embodiments, the VSD material behaves substantially as an insulator or dielectric (i.e., is substantially nonconductive and exhibits a very high or substantially infinite electric resistance) at voltages below the characteristic voltage level. The VSD material then switches to become substantially conductive when operated at voltages above the characteristic voltage level, then becomes again substantially an insulator or dielectric at voltages below the characteristic voltage. The VSD material can continue to alternate between these two operational states an indefinite number of times if the input voltage levels transition between voltages below the characteristic voltage and above the characteristic voltage. While transitioning between these two operational states, a VSD material may experience a certain level of hysteresis, which may alter to a certain extent the characteristic voltage level, the switching response time, or other operational characteristics of the VSD material.

The VSD material provided in various embodiments of the present invention exhibits consistency (i.e., predictable behavior) in its operation in the low and high voltage regimes. In various embodiments, the VSD material responds to various voltages below the characteristic voltage level in substantially similar ways (e.g., the output signals of the VSD material are substantially predictable for a wide range of input signals with voltages below the characteristic voltage level). At low voltages, the VSD material may be expected to be generally bounded within a limited signal envelope. For example, in response to a given input signal, the output signal shape may be expected to stay within a specific voltage response band. Analogously, in various embodiments, the VSD material responds to various voltages above the characteristic voltage level in substantially similar ways. For example, the output signals of the VSD material are substantially predictable for a wide range of input signals with voltages above the characteristic voltage level. Thus, the VSD material may be expected to be generally bounded within a limited signal envelope band (e.g., in terms of signal amplitude, energy, response times, phase, and/or bandwidth).

FIG. 1 illustrates a response of a VSD material to an electrical signal in connection with various embodiments of the present invention. The electrical signal may be the result of an overvoltage event, such as an ESD. FIG. 1 shows a representative response of a VSD material that may be expected to occur in response to an ESD signal. The horizontal axis represents time "t" and the vertical axis represents voltage "V." The traces are normalized to a single scale in FIG. 1. The trace 130 shows an input voltage signal, such as an ESD signal. The traces 132 and 134 show output signals illustrating an envelope band representing possible responses to similar ESD input signals. A high voltage portion of the ESD signal 130 is clamped (cut off) by the VSD material, which becomes substantially conductive and drives the response voltage towards zero.

The transition between the low voltage regime when the VSD material is substantially insulative and the high voltage regime when the VSD material is substantially conductive in accordance with embodiments of the current invention is substantially predictable and is expected to be generally confined to a limited envelope of signal amplitudes and a limited range of switching times. In an ideal model, the time that it takes a VSD material to transition from a state of substantial insulation to a state of substantial conductance in response to an input step function signal that rises above the characteristic voltage may be approximated as zero. That is, the transition may be approximated as substantially instantaneous. Similarly, in an ideal model, the time that it takes a VSD material to transition from a state of substantial conductance to a state of substantial nonconductance in response to an input step function signal that drops below the characteristic voltage may be approximated as zero. This reverse transition may also be approximated to be substantially instantaneous. Under normal operating conditions, however, both of these transition times for VSD materials are non-zero. In general, such transition times are small, and are preferably as small as possible (e.g., in the range of about $10^{-6}$ seconds, $10^{-9}$ seconds, $10^{-12}$ seconds, or smaller). For further details of the formulations and characteristics of VSD material, please refer to U.S. Pat. No. 7,872,251, issued Jan. 18, 2011, to Kosowsky, et al., and titled "Formulations for Voltage Switchable Dielectric Material Having a Stepped Voltage Response and Methods for Making the Same," which is hereby incorporated by reference in its entirety.

When in a substantially conductive state, a VSD material in accordance with various embodiments of the present invention provides a shunt for an input electrical signal to ground or to another predetermined point within the respective circuit or device to protect an electronic component. In various embodiments, the predetermined point is a ground, virtual ground, shield, safety ground, and the like. Examples of electronic components that may be operated with and/or protected by VSD materials in accordance with various embodiments of the present invention include (a) circuit element, circuit structure, PCB or other circuit board, electronic device, electronic subsystem, electronic system, (b) any other electric, magnetic, microelectromechanical structure (MEMS) or similar element, structure, component, system and/or device, (c) any other unit that processes or transmits data and operates using electric signals or may be damaged by electric signals, and (d) any combination of the foregoing identified in (a), (b) and/or (c) above.

A VSD material in various embodiments may provide separation between two conductors or components in the form of a gap filled by the VSD material, such that at normal voltages below the characteristic voltage level the conductors are substantially not in electrical communication. At high voltages above the characteristic voltage level, current may pass from one conductor to the other across the gap, through the VSD material.

Figure 3:
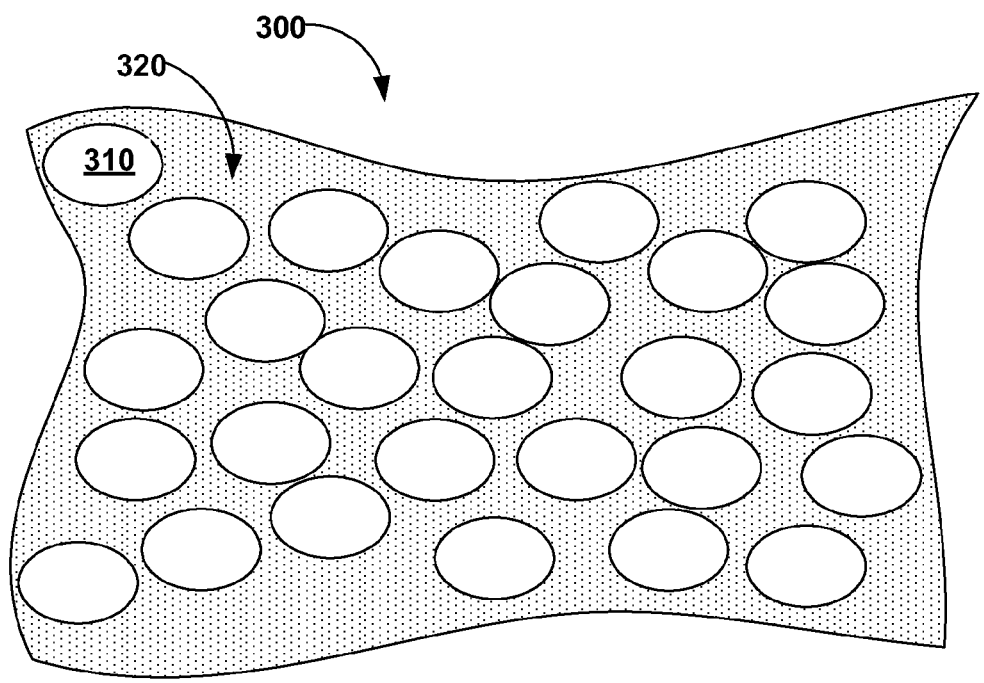
FIG. 3 is a diagram illustrating a cross section of a VSD material that may be used in connection with various embodiments of the present invention.

VSD materials in accordance with various embodiments of the present invention are polymer-based, and may include filled polymers. A filled polymer may include particulate materials such as metals, semiconductors, ceramics, and the like. FIG. 3 is a diagram illustrating a cross section of a VSD material 300 that may be used in accordance with various embodiments of the present invention. VSD material 300 may include a conductive material 310 (e.g., a metal), and/or an insulating and/or semiconducting material 320 (e.g., a polymer). VSD material 300 may include organic and/or inorganic materials. As discussed elsewhere herein, at voltages below the characteristic voltage level VSD material 300 behaves substantially as an insulator. At voltages above the characteristic voltage (sometimes also denoted in connection with ESD protection a trigger voltage, clamp voltage, cut-off voltage, protection voltage, or with other similar terms), VSD material 300 behaves substantially as a conductor. VSD material 300 may be connected to a protection point, such as an electrical ground, to shunt current to ground during high voltage conditions for protection of a component.

Figure 2:
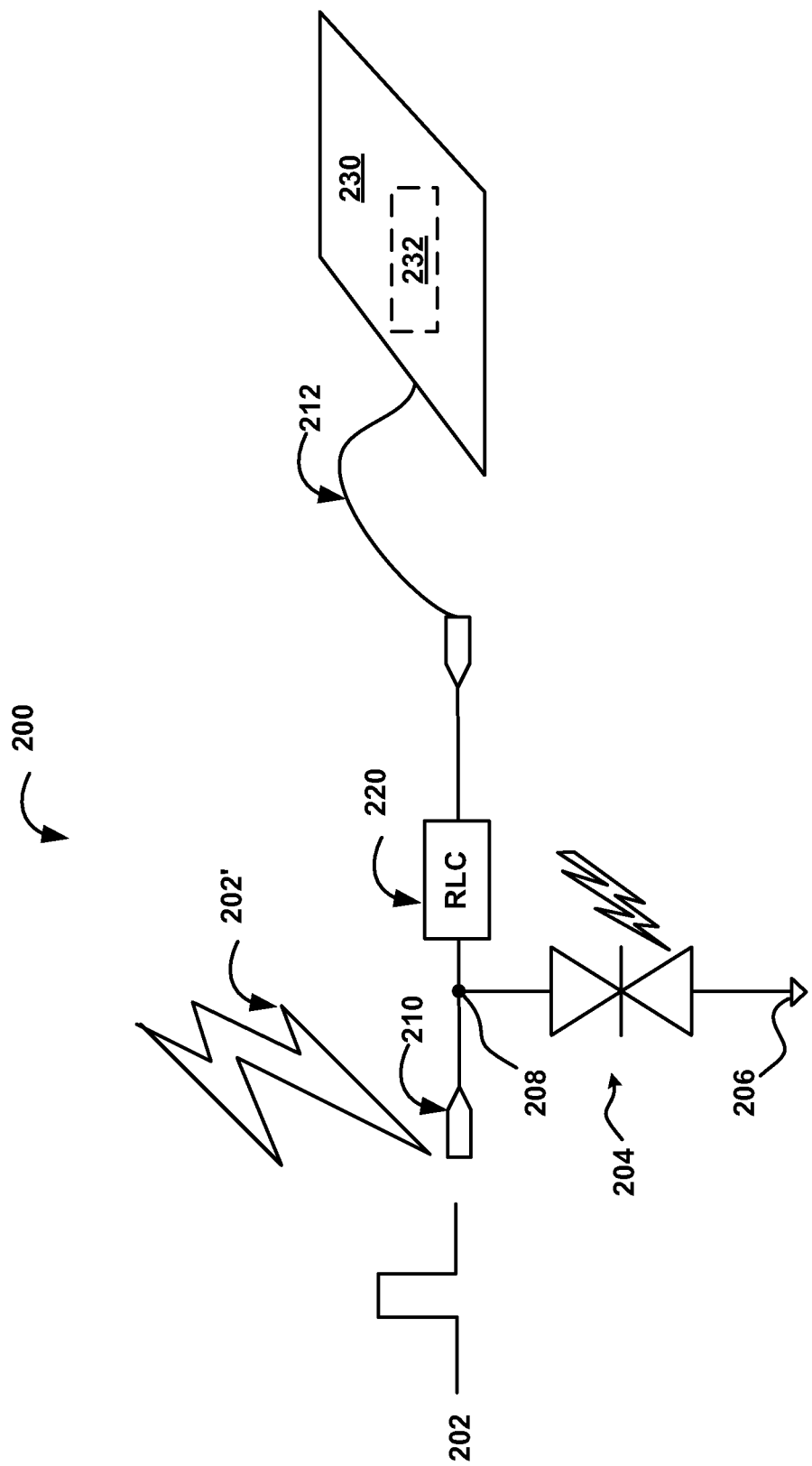
FIG. 2 illustrates a circuit incorporating a VSD material for protecting an electronic component in accordance with an embodiment of the present invention.

FIG. 2 illustrates a circuit 200 incorporating a VSD material 204 for protecting an electronic component 230 in accordance with an embodiment of the present invention. The circuit 200 may be a device or may be incorporated into a device. In various embodiments, the electronic component 230 includes a chip, resistor, inductor, capacitor, diode, transistor, and/or the like that may be sensitive to an overvoltage condition.

The VSD material 204 in the embodiment of FIG. 2 is connected to a conductor 210. The conductor 210 shown in FIG. 2 is part of an electrical path or circuit that transmits a signal 202 to the electronic component 230. A potential incoming overvoltage signal 202', such as an ESD pulse, may be applied to the signal 202 and coupled to the conductor 210. However, the circuit 200 is configured to use the VSD material 204 to limit transmission of potentially damaging portions of the overvoltage signal 202' to the electronic component 230. Overvoltage signal 202' is an electric signal that may exhibit a relatively-high voltage, relatively-high current, or other characteristics that may be damaging to electronic components.

The VSD material 204 of FIG. 2 is illustrated as a device configured to electrically couple a node 208 to a second point 206 when an input voltage exceeds a characteristic voltage level. While FIG. 2 shows the circuit 200 as including a single VSD material 204, it will be readily recognized by those skilled in the art that two or more implementations of VSD material 204 may be utilized (e.g., a second structure of VSD material may be disposed between conductive lead 212 and a ground or other point similar to second point 206). Moreover, various embodiments of VSD material 204 include VSD material configured as a layer of a substrate, a pattern disposed on a substrate, a device, a device embedded in a substrate, a device embedded in a via, a separation material, and the like. In some embodiments, the VSD material 204 is a structure of VSD material that is embedded in a substrate such as a PCB or another circuit board. The VSD material 204 may be a layer of VSD material or a structure of VSD material that is disposed on a surface of a substrate. The VSD material 204 may be configured as a layer of VSD material or a structure of VSD material that is disposed as a layer inside a substrate, or otherwise parallel with the main horizontal plane of the PCB. The VSD material 204 may also comprise a structure of VSD material that is disposed at least partially in a vertical direction or in an oblique direction relative to the general plane of a substrate (e.g., the VSD material may be constructed as a vertical structure crossing two or more layers of a PCB).

The electronic component 230 may be any of various electronic components, including an ESD-sensitive integrated circuit (e.g., implemented in silicon, III-V materials, II-VI materials, and the like). Optionally, the electronic component 230 includes an on-chip ESD protection element 232. The electronic component 230 of FIG. 2 is in electrical communication with conductor 210 via a conductive lead 212. In some cases, electronic component 230 is a surface-mounted chip (e.g., according to Surface Mounted Device, or SMD, standards).

In accordance with an embodiment of the current invention, circuit 200 may include a circuit element 220 for protection of the electronic component 230 from the overvoltage signal 202'. In various embodiments, the circuit element 220 may be, or may include one or more resistors, one or more inductors, one or more capacitors, one or more diodes, one or more transistors, one or more filters (e.g., various combinations of one or more low-pass, band-pass and high-pass filters or filter stages), any other passive or active circuit elements or electronic components, and any combination of the foregoing. The circuit element 220 may comprise a single electronic component or a combination of electronic components, and may be used to provide partial or full ESD protection for the electronic component 230.

In one embodiment, a design for overvoltage protection includes VSD material 204 in electrical communication with circuit element 220 and/or with electronic component 230. In some embodiments, the VSD material 204 is in electrical communication with a side (e.g., lead, port, connector, pin, etc.) of circuit element 220 connected to a conductor 210. The VSD material 204 may be connected to an electrical ground or to other components.

In various embodiments, circuit element 220 includes a voltage or current amplitude and/or frequency filter. For example, the circuit element 220 may be configured as a high pass filter, a low pass filter, or a band pass filter. Circuit element 220 may transmit a first voltage or current (e.g., associated with normal operation of electronic component 230) with no, or substantially no, distortion or attenuation, and may block in whole or in part a second voltage or current associated with abnormal events (e.g., an ESD event). For example, the circuit element 220 may be configured as a low pass filter to transmit the signal 202 at normal or design frequencies. Upon occurrence of an ESD type overvoltage signal 202' including high frequency components, the circuit element 220 may block in whole or in part the high frequency components of the overvoltage signal 202'. The full or partial blocking of the overvoltage signal 202' may provide the VSD material 204 sufficient time to respond to the high voltage regime and switch to a conductive state before the electronic component 230 may be damaged.

An impedance of the circuit element 220 may be selected to pass signal 202 at voltages that would not normally damage electronic component 230 (e.g., voltages below 40 volts, below 24 volts, below 12 volts, below 5 volts, and/or below 3 volts, depending upon the chip specifications). The impedance of the circuit element 220 may be further selected to block overvoltage signal 202' at high and/or potentially damaging voltages (e.g., above 100 volts, above 1000 volts, above 10 kV and the like) depending upon the chip specifications and/or frequency components of the overvoltage signal 202'.

In accordance with various embodiments of the present invention, the VSD material 204, circuit element 220, and component 230 of FIG. 2 are incorporated within an electronic device. For example, the electrical component 230 protected by a structure of VSD material 204 may be a semiconductor chip or another integrated circuit (IC) (e.g., a microprocessor, controller, memory chip, RF circuit, baseband processor, etc.), light emitting diode (LED), MEMS chip or structure, or any other component or circuit element that is disposed inside an electronic device. Examples of such electronic devices that may include components protected against ESD events or other electrical input signals in accordance with embodiments of the present invention include mobile phones, electronic tablets, electronic readers, mobile computers (e.g., a laptop), desktop computers, server computers (e.g., servers, blades, multi-processor supercomputers), television sets, music players (e.g., a portable MP3 music player), personal health management devices (e.g., a pulse monitor, a cardiac monitor, a distance monitor, a temperature monitor, or any other sensor device with applications in health management), light emitting diodes (LEDs) and devices comprising LEDs, and any other consumer and/or industrial devices that process or otherwise store data using electrical or electromechanical signals. Other examples include satellites, military equipment, aviation instruments, and marine equipment.

The overvoltage signal 202' may arrive via a predetermined electrical path in the device (e.g., on a signal line in an electrical circuit, through a conductive line in a PCB), or may arrive via an unintended path (e.g., arcing through the air from a data port that is accessible from outside the device, along an unintended conductive or partially conductive path from the external cover of a mobile phone).

The VSD material 204 of FIG. 2 is disposed between the node 208 and the second point 206. In various embodiments, one or both of the node 208 and the second point 206 is internal to a substrate (e.g., embedded in a layer of a PCB), on a surface of a substrate (e.g., on a conductive line on a surface of a PCB), or external to the substrate (e.g., on a connector or pin connected to a PCB).

In one embodiment, the VSD material 204 and the circuit element 220 are incorporated in a connector that connects to a device to be protected against overvoltage events and the electronic component 230 is incorporated in the device. Examples of such connectors include a power connector, a USB connector, an Ethernet cable connector, an HDMI connector, or any other connector that facilitates serial, parallel or other types of data, signal or power transmission. In one embodiment, the VSD material 204 is incorporated in a connector that connects to a device to be protected against overvoltage events and the circuit element 220 and the electronic component 230 are incorporated in the device. In such embodiments, a structure of VSD material and a circuit element such as those illustrated in the embodiment of FIG. 2 can be built directly in a cable to be connected to a device, and can provide ESD or other overvoltage signal protection to the respective device once the cable is connected. Such embodiments can be used to enhance the value of connectors and/or decrease the probability of ESD damage experienced by devices.

The node 208 is included in a path along which a potentially damaging electrical signal may travel, such as the overvoltage signal 202'. As shown in FIG. 2, the circuit element 220 and the VSD material 204 are directly connected to the node 208. In some embodiments, additional components may be disposed between the node 208 and the VSD material 204, and/or between the node 208 and the circuit element 220.

In various embodiments, the second point 206 is a ground, virtual ground, a shield, a safety ground, a package shell, a conductive line, a direct or indirect connection to a component, a point along any other electrical path, or any combination of the foregoing. While the second point 206 is shown in FIG. 2 as directly connected to a ground, the second point 206 may be virtually any predetermined net, potential or other reference or point within the device to which the overvoltage signal 202' may be directed in whole or in part or from which an electrical signal may be received.

In some embodiments, the VSD material provides partial overvoltage protection to the component 230. Upon occurrence of an overvoltage signal 202', such as an ESD pulse, the VSD material 204 switches to a substantially conductive state. Upon becoming substantially conductive, the VSD material 204 is configured to shunt at least a first portion of the overvoltage signal 202' to the second point 206, thus, attenuating the overvoltage signal 202' at the node 208. In this configuration, an attenuated second portion of overvoltage signal 202' may reach the electrical component 230 rather than the full overvoltage signal 202'. By redirecting at least a portion of the overvoltage signal 202' to the second point 206, and transmitting the attenuated portion of the overvoltage signal 202' to the component 230, the VSD material 204 prevents the redirected portion of the overvoltage signal 202' from reaching the component 230, thus, providing at least partial overvoltage protection to the component 230.

The attenuated portion of the overvoltage signal 202' may be further attenuated by the circuit element 220. The attenuated portion of overvoltage signal 202' at node 208 may be further attenuated using the circuit element 220 before reaching the component 230, in which case the component 230 receives a smaller portion of the overvoltage signal 202' than is present at the node 208.

In some embodiments, the attenuated portion of the overvoltage signal 202' that is transmitted to the component 230 experiences a voltage drop across the circuit element 220. By controlling this voltage drop (e.g., through appropriate design specifications produced in accordance with protector characteristics developed as discussed below in connection with the embodiment of FIG. 3), the voltage and current received at the component 230 may be decreased to non-damaging or otherwise predetermined levels.

Alternatively, in one embodiment, the entire overvoltage signal 202', or substantially the entire overvoltage signal 202', is transmitted by the VSD material 204 to the second point 206. In this case, no current or voltage, or substantially no current or voltage, of the overvoltage signal 202' is routed from the node 208 to the component 230.

In one embodiment, the clamping voltage of the VSD material 204 (i.e., the voltage that may be measured at the node 208 when the VSD material has become substantially conductive) is higher than the maximum voltage that could be safely tolerated by the component 230. Consequently, in this embodiment, an impedance of circuit element 220 may be configured for further attenuation of the current and/or voltage experienced at the lead 212 to a decreased level that can be more safely tolerated by the component 230.

In general, various embodiments of the invention may provide protector characteristics that can be implemented to produce a circuit element 220 having a transfer function that attenuates or suppresses any or all of the signal characteristics of various components of the overvoltage signal 202' present at the node 208 that could damage the component 230. Examples of signal characteristics of overvoltage signals or of other electrical signals that can be attenuated or suppressed by a circuit element in accordance with embodiments of the current invention include voltage, current, frequency and/or bandwidth (e.g., an expected frequency spectrum), time value, and/or pulse shape.

The circuit element 220 may be configured to temporarily block the overvoltage signal 202' while the VSD material 204 switches to the conductive state. In some embodiments, the overvoltage signal 202' includes a pulse, such as an ESD pulse, having a leading edge that rises rapidly. While the VSD material 204 may be configured to switch fast, the response time of VSD materials is generally subject to a nonzero time delay. The leading edge of some ESD pulses may rise faster than the response time of the VSD material 204 in the circuit 200. Thus, the voltage at the node 208 can momentarily exceed the damage threshold of the electronic component 230. The circuit element 220 may include elements, such as a low pass filter, configured to block high frequency components such as may characterize fast rising pulses. In various embodiments, the circuit element 220 blocks the rising pulse when it is at a voltage level that is less than the characteristic voltage of the VSD material 204. That is, to provide the electronic component 230 with additional protection, the circuit element 220 may be configured to block the overvoltage event before the VSD material 204 begins switching. Thus, the circuit element 220 can block one or more characteristics or components of the overvoltage signal 202' (e.g., the rising edge of a pulse in the overvoltage signal 202') during the time it takes for the VSD material 204 to switch from the insulation state to the conductive state.

In various embodiments, the predetermined point to which a VSD material reroutes at least part of the input electrical signal may be a ground or may be the input to one or more other electronic components, different from the electronic component being protected. In the embodiment of FIG. 2, the point to which the VSD material 204 reroutes at least a portion of the overvoltage signal 202' is the second point 206, which is illustrated as connected directly to ground.

In various embodiments, a structure of VSD material 204 is embedded in a substrate. When it becomes substantially conductive, the VSD material 204 provides an electrical path through the substrate to the second point 206. An embedded structure of VSD material in accordance with various embodiments of the present invention provides numerous advantages over traditional discrete components that may have been used in the prior art as part of ESD protection circuits. Examples of traditional discrete ESD components that may have been used in the prior art as part of ESD protection circuits include capacitors, resistors, inductors, diodes, discrete components (including, possibly, discrete components manufactured with voltage switched dielectric materials, but where such discrete components were not in any event embedded in any substrate or in any other component or portion of a device such as a PCB), and combinations of the foregoing.

Embedding a structure of VSD material, such as VSD material 204, in a substrate in accordance with various embodiments of the present invention provides various advantages. Some of those advantages include the following: (a) The embedded VSD material structures may be prebuilt into a substrate, such as a PCB, at a time when the substrate is manufactured, thus, avoiding a need to add discrete ESD components at a later time. (b) Design of the ESD protection can be performed at a higher level (e.g., at a system level or PCB level), so that ESD protection can be optimized across multiple components or across an entire system or subsystem. In contrast, using discrete ESD components often leads to no optimization beyond the specific component or components being protected. (c) The cost of using discrete ESD components may be avoided or substantially decreased by using embedded structures of VSD material that are prebuilt into the substrate.

In various embodiments of the present invention, various combinations of VSD material 204, the circuit element 220, and the electronic component 230 may be embedded in a single substrate or in a plurality of substrates that are in electrical communication with each other. In some embodiments, VSD material 204 and/or circuit element 220 are embedded in a printed circuit board (e.g., fabricated as layers in a PCB stackup). In some embodiments, circuit element 220 includes a via. Optionally, the circuit element 220 is implemented in a via, and that via may be filled with a material having appropriate properties. For example, a via filled with a resistive paste (e.g., silver paste) may have a desired resistance (e.g., a higher resistance than a plated via, but a low enough resistance to conduct a desired current). In some cases, the filled via (operating as circuit element 220 and/or lead 212) connects a VSD material embedded in a layer to a component (e.g., a chip) disposed on another layer or otherwise attached to the substrate.

Figure 4:
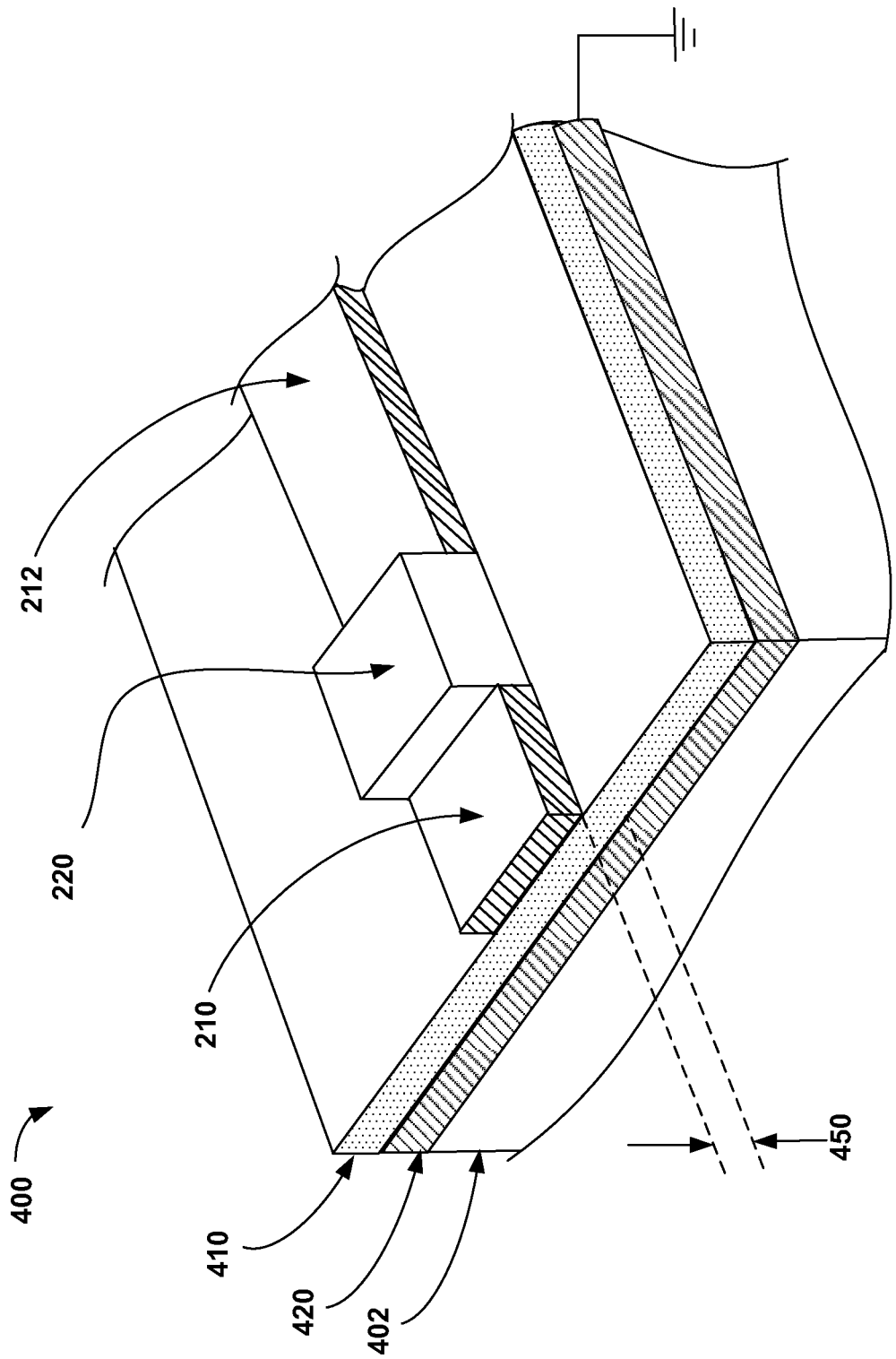
FIG. 4 is a block diagram illustrating an exemplary stackup in accordance with an embodiment of the present invention.

FIG. 4 is a block diagram in partial cross section illustrating an exemplary stackup 400 in accordance with an embodiment of the present invention. Only a portion of the stackup 400 is illustrated in FIG. 4. The stackup 400 of FIG. 4 includes a substrate 402, a conductor 420, and a VSD material 410. The substrate 402 may be representative of a printed circuit board, a layer thereof, a package, a chassis, an enclosure, and/or other assembly. The VSD material 410 may be included in a structure of VSD material (e.g., the VSD material 204). In various embodiments, the VSD material 410 is disposed as a layer, line, via, pattern, and/or other shape. The VSD material 410 may generally be connected to the conductor 420. The conductor 420 may be connected to any of a ground, virtual ground, shell, shield, safety ground, chassis, package, case, and the like.

The stackup 400 of FIG. 4 further includes the conductor 210, the circuit element 220 and the lead 212 of FIG. 2. The conductor 210, the circuit element 220 and the lead 212 of FIG. 4 are disposed on the VSD material 410. The lead 212 connected to circuit element 220 may be connected to a component such as component 230 (not shown in FIG. 4). The circuit element 220 is represented in FIG. 4 as a block, however in various embodiments, the circuit element 220 includes any of discrete components, integrated circuits, filters, active devices, passive devices, socket devices, surface mount devices and the like. The conductor 210 and lead 212 are represented in FIG. 4 as blocks, however in various embodiments, the conductor 210 and/or lead 212 include any of connectors, edge connectors, pads, traces, sockets, leads, solder points, pins, test points, wires, etched pattern, screened patterns, and the like.

The VSD material 410 may separate a conductor, such as the conductor 210 and/or lead 212, from the (grounded) conductor 420 such that current passes from the lead to the conductor 420 during an overvoltage condition (such as an ESD event) via the VSD material 410. The VSD material 410 separation may form a gap 450 between the conductor 210 and the conductor 420. The gap 450 may extend to separate the circuit element 220 and the conductor 420, and/or the lead 212 and the conductor 420, which separation is not visible in this view. The VSD material 410 may pass current across the gap 450 during the overvoltage condition. Additional PCB components (e.g., additional layers of pre-impregnated composite fibers, or prepreg) may be added above, below, and/or around the stackup 400 to embed the stackup 400.

Figure 5:
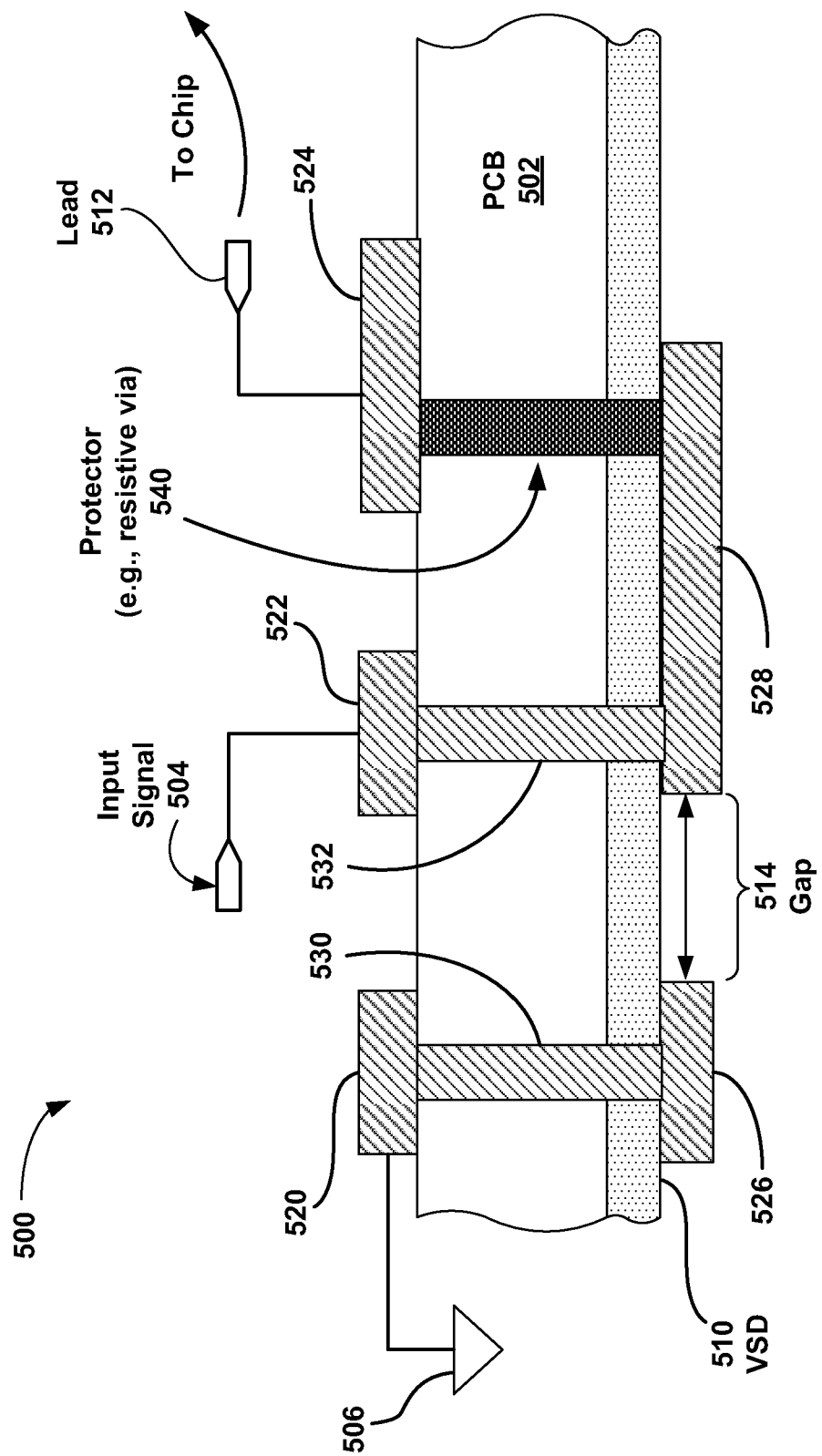
FIG. 5 is a block diagram showing a cross section illustration of an embedded protector element in a segment of a stackup in accordance with an embodiment of the present invention.

FIG. 5 is a block diagram showing a cross section illustration of an embedded protector element 540 in a segment of a stackup 500, in accordance with an embodiment of the present invention. The stackup 500 differs from the stackup 400, inter alia, in that the stackup 500 includes vias. Stackup 500 of FIG. 5 includes an insulating substrate 502 and a layer of VSD material 510. Conductors 520, 522, and 524 (e.g., conductive pads) are disposed on a surface of the substrate 502. Conductors 526 and 528 (e.g., conductive pads) are disposed on a surface of the VSD material 510. More or fewer conductive pads may be disposed on the surface of the PCB substrate 502 and/or VSD material 510.

Vias are configured to connect various conductive pads of FIG. 5. Conductive via 530 electrically couples the conductors 520 and 526 and conductive via 532 electrically couples conductors 522 and 528. Vias 530 and 532 may be "regular" vias configured to conduct current with minimal resistance. Alternatively, via 530 comprises a vertical structure of VSD material that is disposed in a vertical direction relative to the general plane of the substrate 502 (crossing two or more layers of a PCB) and configured to provide protection for components in circuit of stackup 500.

In some embodiments, the protectors form a via or are disposed within a via. Protectors may be disposed within substrate 502. The protector 540 illustrated in FIG. 5 is disposed within (e.g., may be a part of) a via. In some embodiments, the protector 540 is configured as a resistor in the form of a via filled with a material having a desired resistance (e.g., a resistance greater than the high conductivity metal typically used to fill vias, but low enough that some current may pass). In some cases, a via includes a filled polymer (e.g., a paste) having insulating and conducting phases). In another example, a via may be filled with silver paste. In some embodiments, the via 540 includes the circuit element 220 of FIG. 2.

Under normal conditions (i.e., input voltage signals are below a characteristic voltage level), an input signal is electrically coupled to a chip or electronic component (e.g., electronic component 230). Under such normal conditions, the input signal 504 of FIG. 5 follows a path including conductor 522, the via 532, conductor 528, protector 540, conductor 524, the lead 512 to the chip.

Under overvoltage conditions (e.g., an ESD event where the input signal exceeds a characteristic voltage level), the input signal may be coupled to a protective point such as 506. A gap 514 may be disposed between adjacent pads 526 and 528. The VSD material 510 that is configured to couple current across the gap 514 during overvoltage conditions may span the gap 514. Characteristics of the VSD material 510 may be determined such that when an overvoltage signal occurs at input signal 504, the overvoltage at conductor 528 is conducted through the portion of VSD material 510 spanning the gap 514 to conductor 526. Thus, an overvoltage on the input signal 504 is shunted through a path including conductor 522, the via 532, conductor 528, (a portion of) VSD material 510, conductor 526, the via 530, and conductor 520 to the protective point 506. As discussed above, the protector 540 may provide additional overvoltage protection for the chip. For example, a low pass filter disposed in the protector/via 540 may provide a blocking high frequency component when presented with a rapid rise in voltage while the portion of the VSD material in the gap between conductor 528 and conductor 526 switches to the conductive state. In various embodiments, the protective point 506 is a ground, virtual ground, a shield, a safety ground, a package shell, a conductive line, a direct or indirect connection to a component, a point along any other electrical path, or any combination of the foregoing.

Figure 6:
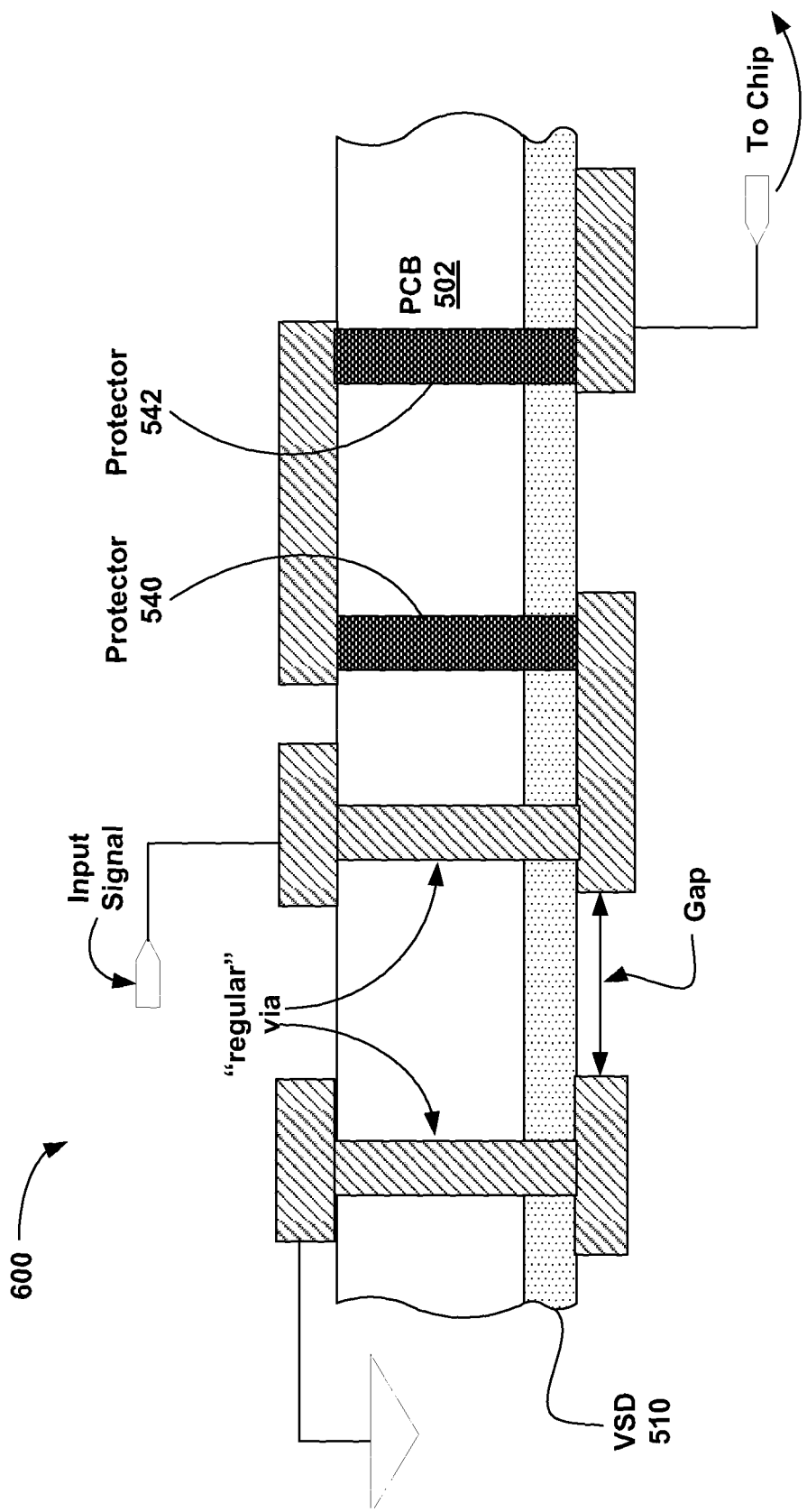
FIG. 6 is a block diagram showing a cross section illustration of multiple embedded protector elements in a segment of a stackup 600 in accordance with an embodiment of the present invention.

FIG. 6 is a block diagram showing a cross section illustration of multiple embedded protector elements 540 and 542 in a segment of a stackup 600 in accordance with an embodiment of the present invention. FIG. 6 differs from FIG. 5 in that two protectors 540 and 542 (e.g., resistors) are disposed in series. Thus, VSD material 510 may be connected to both legs of a protector (e.g., a lead going to signal and a lead going to the chip being protected). While two protector elements 540 and 542 are illustrated in FIG. 6, more protector elements may be disposed in the stackup 500.

Figure 7:
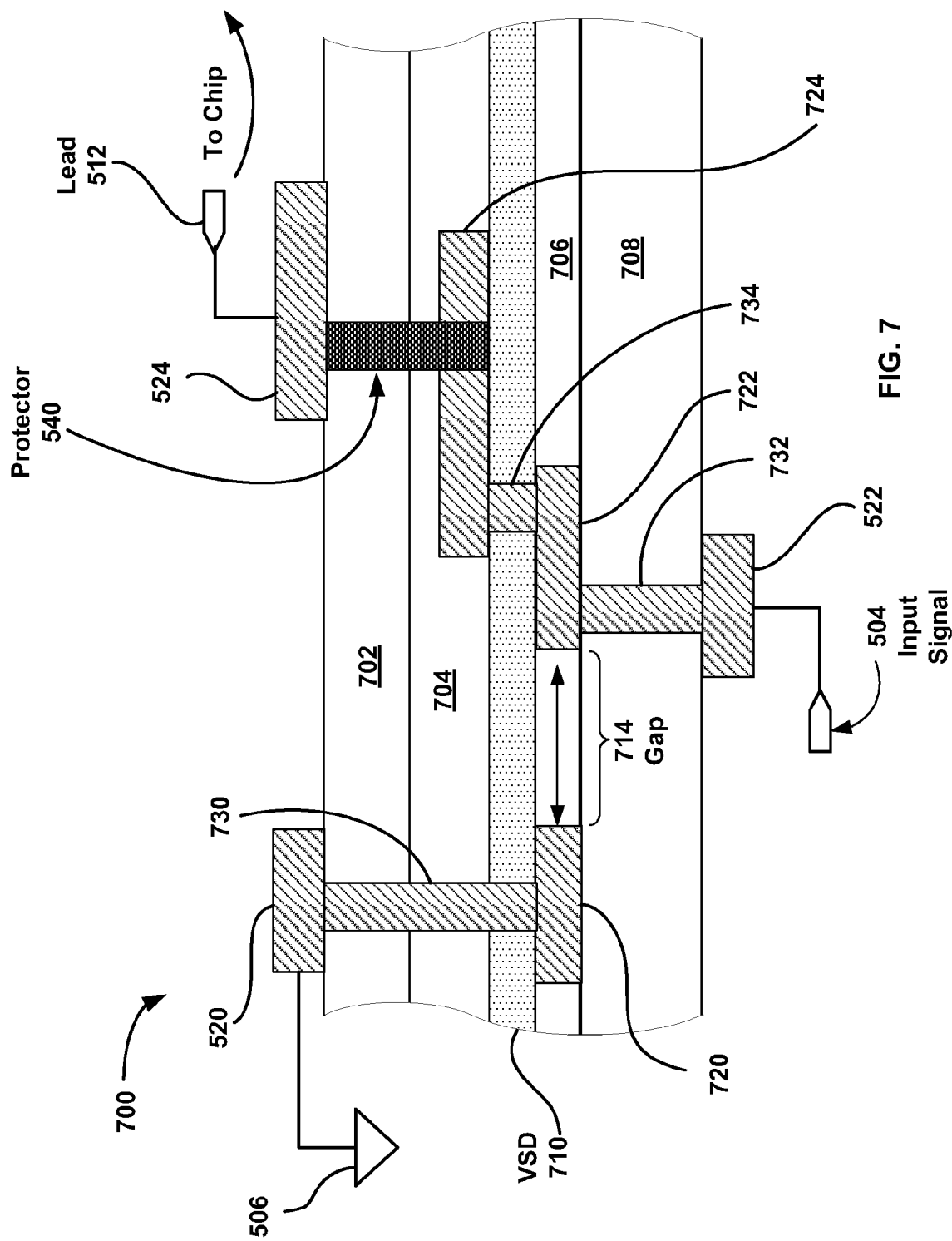
FIG. 7 is a block diagram showing a cross section illustration of VSD material, connectors, and vias that are embedded in multiple layers of dielectric material of a stackup in accordance with an embodiment of the present invention.

FIG. 7 is a block diagram showing a cross section illustration of VSD material, connectors, and vias that are embedded in multiple layers of dielectric material of a stackup 700 in accordance with an embodiment of the present invention. The stackup 700 of FIG. 7 includes a VSD material layer 710 and a via 732 embedded between a PCB layer 704 and 706. Additional PCB layers 702 and 708 illustrated in FIG. 7 are configured to embed layers 704 and 706 and conductors 720, 722, and 724.

As in FIGS. 5 and 6, the input signal 504 of FIG. 7 is coupled to an electronic component, such as a chip (e.g., component 230) under low voltage conditions. For example, the input signal 504 may be coupled through a path including conductor 522, the via 732, conductor 722, the embedded via 734, embedded conductor 724, protector 540, conductor 524, and lead 512 to the chip.

Similar to FIGS. 5 and 6, under overvoltage conditions such as an ESD event, the input signal may be conducted across a gap 714 between the conductor 722 and conductor 720. Thus, an overvoltage on the input signal 504 is shunted through a path including conductor 522, via 732, conductor 722, VSD material 710 (at the gap 714), conductor 720, via 730, conductor 520 to the protective point 506. In some embodiments, the via 730 comprises a vertical structure of VSD material that is disposed in a vertical direction relative to the general plane of the substrate 702 and 704 (crossing two or more layers of a PCB) and configured to provide protection for components in the circuit of stackup 700. As discussed above, the protector 540 may provide additional overvoltage protection for the chip by blocking the overvoltage at the signal input 504 while the VSD material 710 switches to the conductive state at the gap 714.

Some embodiments include a computer readable storage medium coupled to a processor and memory. Executable instructions stored on the computer readable storage medium may be executed by the processor to perform various methods described herein. Sensors and actuators may be coupled to the processor, providing input and receiving instructions associated with various methods.

Some embodiments include sensors to sense various parameters (e.g., current, voltage, power, distance, resistance, resistivity, inductance, capacitance, thickness, strain, temperature, stress, viscosity, concentration, depth, length, width, switching voltage and/or voltage density (between insulating and conducting), trigger voltage, clamp voltage, off-state current passage, dielectric constant, time, date, and other characteristics). Various apparatuses may monitor various sensors, and systems may be actuated by automated controls (solenoid, pneumatic, piezoelectric, and the like). Certain instructions provide for closed-loop control of various parameters via coupled sensors providing input and coupled actuators receiving instructions to adjust parameters.

Various embodiments of the present invention include devices for which overvoltage protection may be provided, such as telephones (e.g., cell phones and smart phones), USB-devices (e.g., a USB-storage device), personal digital assistants, laptop computers, netbook computers, tablet PC computers and/or the like.

Some of the embodiments described in this patent may be presented in terms of algorithms and symbolic representations of operations on data bits within a computer memory. In general, an algorithm represents a sequence of steps leading to a desired result. Such steps generally require physical manipulations of physical quantities. Usually, though not necessarily, these quantities take the form of electrical or magnetic signals capable of being stored, transferred, combined, compared, and otherwise manipulated using appropriate electronic devices. Such signals may be denoted as bits, values, elements, symbols, characters, terms, numbers, or using other similar terminology.

When used in connection with the manipulation of electronic data, terms such as processing, computing, calculating, determining, displaying, or the like, refer to the action and processes of a computer system or other electronic system that manipulates and transforms data represented as physical (electronic) quantities within the system's registers and memories into other data similarly represented as physical quantities within the memories or registers of that system of or other information storage, transmission or display devices.

Various embodiments of the present invention may be implemented using an apparatus or machine that executes programming instructions. Such an apparatus or machine may be specially constructed for the required purposes, or may comprise a general purpose computer selectively activated or reconfigured by a software application.

Algorithms, methods and processes discussed in connection with various embodiments of the present invention are not inherently related to any particular computer or other apparatus. Various general purpose systems may be used with programs in accordance with the teachings herein, or it may prove convenient to construct more specialized apparatus to perform the required method steps. In addition, embodiments of the present invention are not described with reference to any particular programming language, data transmission protocol, or data storage protocol. Instead, a variety of programming languages, transmission or storage protocols may be used to implement various embodiments of the invention.

As used in this patent, a set means any group of one, two or more items. Analogously, a subset means, with respect to a set of N items, any group of such items consisting of N−1 or less of the respective items.

As used in this patent, the terms "include," "including," "for example," "exemplary," "e.g.," and variations thereof, are not intended to be terms of limitation, but rather are intended to be followed by the words "without limitation" or by words with a similar meaning. Definitions in this specification, and all headers, titles and subtitles, are intended to be descriptive and illustrative with the goal of facilitating comprehension, but are not intended to be limiting with respect to the scope of the inventions as recited in the claims. Each such definition is intended to also capture additional equivalent items, technologies or terms that would be known or would become known to a person of average skill in this art as equivalent or otherwise interchangeable with the respective item, technology or term so defined. Unless otherwise required by the context, the verb "may" indicates a possibility that the respective action, step or implementation may be performed or achieved, but is not intended to establish a requirement that such action, step or implementation must be performed or must occur, or that the respective action, step or implementation must be performed or achieved in the exact manner described.

The above description is illustrative and not restrictive. This patent describes in detail various embodiments and implementations of the present invention, and the present invention is open to additional embodiments and implementations, further modifications, and alternative constructions. There is no intention in this patent to limit the invention to the particular embodiments and implementations disclosed; on the contrary, the patent is intended to cover all modifications, equivalents and alternative embodiments and implementations that fall within the scope of the claims. The scope of the invention should, therefore, be determined not with reference to the above description, but instead should be determined with reference to the appended claims along with their full scope of equivalents.

What is claimed is:

1. A circuit for protecting an electronic component of an electronic device against an overvoltage signal, the circuit comprising: a voltage switchable dielectric (VSD) material embedded in a substrate, the VSD material disposed between a first point located along an expected electrostatic discharge (ESD) signal path and a second point located within the device, the VSD material having a characteristic voltage level; a circuit element disposed between the first point and the electronic component, the circuit element comprises a filter and the filter is disposed in a vial; and a first conductor pad and a second conductor pad separated by a gap, wherein the first and second conductor pads are disposed on a surface of the VSD material, wherein the VSD material is configured to transmit to the second point a first portion of the overvoltage signal present at the first point when a voltage of the overvoltage signal exceeds the characteristic voltage level, and wherein the circuit element is configured to transmit a second portion of the overvoltage signal to the electronic component while modifying at least one signal characteristic of the second portion of the ESD signal, and wherein the VSD material is configured to couple current across the gap from the first conductor pad to the second conductor pad when a voltage of the overvoltage signal exceeds the characteristic voltage level.

2. The circuit of claim 1, wherein the second point located within the device is a ground or is in electrical communication to a ground signal level.

3. The circuit of claim 1, wherein the second point located within the device is electrically coupled to an electronic component other than the component that receives the second portion of the overvoltage signal from the circuit element.

4. The circuit of claim 1, wherein the substrate is a PCB and the VSD material is at least a part of a layer of the PCB.

5. The circuit of claim 4, wherein the layer of the PCB including the VSD material is inside the PCB or is at a surface of the PCB.

6. The circuit of claim 1, wherein the filter is a low-pass filter, a band-pass filter, or a high-pass filter.

7. The circuit of claim 1, wherein the circuit element is embedded in the substrate.

8. The circuit of claim 1, wherein the VSD material is further configured to protect the circuit element against the overvoltage signal.

9. The circuit of claim 1, wherein the circuit is incorporated in a connector.

10. The circuit of claim 1, wherein the substrate and the circuit element are part of a connector, and the component is part of a device to which the connector is attached.

11. The circuit of claim 1, wherein the device is a mobile phone, electronic tablet, electronic reader, mobile computer, desktop computer, server computer, television set, music player, personal health management device, or another consumer electronic device that processes or stores data using electrical or electromechanical signals.

12. The circuit of claim 1, wherein the at least one signal characteristic that the circuit element is configured to modify includes any of a voltage value, a current intensity value, a power value, a frequency value, a bandwidth value, and a propagation delay value.

13. An electronic device comprising: a substrate; a component disposed on the substrate; a voltage switchable dielectric material (VSD material) embedded in the substrate; a circuit element electrically connected to the VSD material and to the component, the circuit element separating the VSD material and the component, the circuit element comprises a filter and the filter is disposed in a via; and a first conductor pad and a second conductor pad separated by a gap, wherein the first and second conductor pads are disposed on a surface of the VSD material, and wherein the VSD material is configured to become substantially conductive when an input signal reaching the circuit element exceeds a characteristic voltage level of the VSD material, the VSD material thereby preventing at least a portion of the input signal from propagating to the component through the circuit element, and wherein the VSD material is configured to couple current across the gap from the first conductor pad to the second conductor pad when a voltage of the overvoltage signal exceeds the characteristic voltage level.

14. The electronic device of claim 13, wherein the substrate is a PCB and the VSD material comprises at least a portion of a layer of the PCB.

15. The electronic device of claim 13, wherein the circuit element is embedded within the substrate.

16. The electronic device of claim 13, wherein the device is a mobile phone, electronic tablet, electronic reader, mobile computer, desktop computer, server computer, television set, music player, personal health management device, or another consumer electronic device that processes or stores data using electrical or electromechanical signals.

17. The electronic device of claim 13, wherein the circuit element is configured to transmit a portion of input signal to the electronic component while modifying at least one signal characteristic of the transmitted portion of the input signal.

18. The electronic device of claim 13, wherein the component includes any of a chip, an integrated circuit, a semiconductor, a resistor, an inductor, a capacitor, and a diode.

* * * * *